(12) United States Patent
Yu et al.

(10) Patent No.: US 9,871,009 B2
(45) Date of Patent: Jan. 16, 2018

(54) SEMICONDUCTOR DEVICE AND METHOD

(71) Applicant: Taiwan Semiconductor Manufacturing Company, Ltd., Hsin-Chu (TW)

(72) Inventors: Chen-Hua Yu, Hsin-Chu (TW); Ming-Che Ho, Tainan (TW); Hung-Jui Kuo, Hsin-Chu (TW); Yi-Wen Wu, Xizhi (TW); Tzung-Hui Lee, New Taipei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 15/182,723

(22) Filed: Jun. 15, 2016

(65) Prior Publication Data
US 2017/0365564 A1    Dec. 21, 2017

(51) Int. Cl.
*H01L 21/00*    (2006.01)
*H01L 23/00*    (2006.01)
*H01L 21/66*    (2006.01)

(52) U.S. Cl.
CPC ............ *H01L 24/02* (2013.01); *H01L 22/14* (2013.01); *H01L 24/05* (2013.01); *H01L 24/13* (2013.01); *H01L 2224/02185* (2013.01); *H01L 2224/02315* (2013.01); *H01L 2224/02375* (2013.01); *H01L 2224/02379* (2013.01); *H01L 2224/0401* (2013.01); *H01L 2224/05024* (2013.01); *H01L 2224/13026* (2013.01)

(58) Field of Classification Search
CPC ......... H01L 24/02; H01L 24/05; H01L 21/00; H01L 21/76; H01L 21/768; H01L 21/78; H01L 21/56; H01L 21/3205; H01L 21/683; H01L 24/13
USPC .................................................. 257/613, 737
See application file for complete search history.

(56) References Cited

U.S. PATENT DOCUMENTS

| | | |
|---|---|---|
| 2005/0173786 A1 | 8/2005 | Huang |
| 2011/0193220 A1 | 8/2011 | Kuo et al. |
| 2013/0249589 A1* | 9/2013 | Chen .................. H01L 22/14 324/762.01 |
| 2014/0312390 A1* | 10/2014 | Tsai .................. H01L 29/7302 257/197 |
| 2015/0371951 A1 | 12/2015 | Yeh et al. |
| 2016/0284639 A1* | 9/2016 | Chen .................. H01L 23/525 |

FOREIGN PATENT DOCUMENTS

| | | |
|---|---|---|
| TW | 200527557 A | 8/2005 |
| TW | 201128749 A | 8/2011 |
| TW | 201601248 A | 1/2016 |

* cited by examiner

*Primary Examiner* — Chuong A Luu
(74) *Attorney, Agent, or Firm* — Slater Matsil, LLP

(57) ABSTRACT

A semiconductor device and method of manufacturing is provided, whereby a support structure is utilized to provide additional support for a conductive element in order to eliminate or reduce the formation of a defective surface such that the conductive element may be formed to have a thinner structure without suffering deleterious structures.

20 Claims, 7 Drawing Sheets

SEMICONDUCTOR DEVICE AND METHOD

BACKGROUND

Since the invention of the integrated circuit (IC), the semiconductor industry has experienced rapid growth due to continuous improvements in the integration density of various electronic components (i.e., transistors, diodes, resistors, capacitors, etc.). For the most part, this improvement in integration density has come from repeated reductions in minimum feature size, which allows more components to be integrated into a given area.

However, merely decreasing the minimum feature size of transistors, diodes, resistors, capacitors and the like are merely one aspect that can be improved in the attempts to reduce the overall size of semiconductors devices. Other aspects that are currently under review include other aspects of the semiconductor devices. Improvements in these other structures are being investigated for reductions in size.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
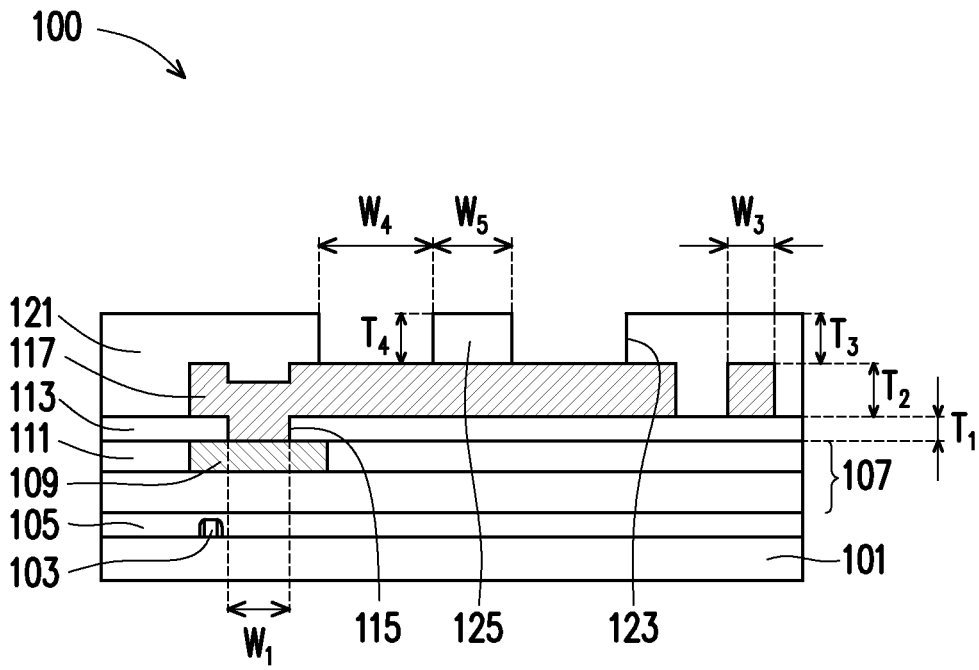
FIG. 1 illustrates a formation of a polymer layer over a redistribution layer in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

With reference now to FIG. 1, there is shown a semiconductor device 100 with a substrate 101, active devices 103 on the substrate 101, an interlayer dielectric (ILD) layer 105 over the active devices 103, and metallization layers 107 over the ILD layer 105. The substrate 101 may be substantially conductive or semiconductive with an electrical resistance of less than $10^3$ ohm-meter and may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates. Additionally, the substrate 101 at this point in the process may be part of a semiconductor wafer (the full wafer of which is not illustrated in FIG. 1) that will be singulated in a later step.

The active devices 103 are represented in FIG. 1 as a single transistor. However, as one of skill in the art will recognize, a wide variety of active devices such as capacitors, resistors, inductors and the like may be used to generate the desired structural and functional requirements of the design for the semiconductor device 100. The active devices 103 may be formed using any suitable methods either within or else on the surface of the substrate 101.

The ILD layer 105 may comprise a material such as boron phosphorous silicate glass (BPSG), although any suitable dielectrics may be used. The ILD layer 105 may be formed using a process such as PECVD, although other processes, such as LPCVD, may alternatively be used. The ILD layer 105 may be formed to a thickness of between about 100 Å and about 3,000 Å.

The metallization layers 107 are formed over the substrate 101, the active devices 103, and the ILD layer 105 and are designed to connect the various active devices 103 to form functional circuitry. While illustrated in FIG. 1 as two layers, the metallization layers 107 are formed of alternating layers of dielectric and conductive material and may be formed through any suitable process (such as deposition, damascene, dual damascene, etc.). In an embodiment there may be four layers of metallization separated from the substrate 101 by the ILD layer 105, but the precise number of metallization layers 107 is dependent upon the design of the semiconductor device 100.

At the top of the metallization layers 107 there is a top metal layer 109 surrounded by a top dielectric layer 111. In an embodiment the top metal layer 109 comprises the conductive material, such as copper or other suitable conductor, formed within the top dielectric layer 111, which may be any suitable dielectric, such as a low-k dielectric material. The top dielectric layer 111 may be initially formed over the remainder of the metallization layers 107 and then the top metal layer 109 may be formed within the top dielectric layer 111 using, e.g., a damascene or dual damascene process, although any suitable process or materials may be used.

A first passivation layer 113 may be formed on the substrate 101 over the metallization layers 107 (and the top metal layer 109 and top dielectric layer 111 within the metallization layers 107). The first passivation layer 113 may be made of one or more suitable dielectric materials such as silicon oxide, silicon nitride, low-k dielectrics such as carbon doped oxides, extremely low-k dielectrics such as porous carbon doped silicon dioxide, combinations of these, or the like. The first passivation layer 113 may be formed through a process such as chemical vapor deposition (CVD), although any suitable process may be utilized, and may have a first thickness $T_1$ between about 7 KÅ and about 14 KÅ, such as about 9.75 KÅ.

In a particular embodiment, the first passivation layer 113 may be formed as a composite layer with a layer of silicon nitride, a layer of undoped silicate glass (USG), and another layer of silicon nitride. In such an embodiment the first silicon nitride layer may be 5 KÅ thick, the layer of USG may be 4 KÅ thick, and the second layer of silicon nitride may be 750 Å thick. However, any suitable combination of materials and thicknesses may be utilized.

After the first passivation layer 113 has been formed, first openings 115 may be made through the first passivation layer 113 by removing portions of the first passivation layer 113 to expose at least a portion of the top metal layer 109. The first openings 115 allow for contact between the top metal layer 109 and a first redistribution layer 117. The first openings 115 may be formed using a suitable photolithographic mask and etching process, although any suitable process to expose portions of the top metal layer 109 may be used, and the first openings 115 may be formed to have a first width $W_1$ of between about 1.5 μm and about 20 μm, such as about 2.7 μm.

Once the first openings 115 have been made, the first redistribution layer 117 may be formed. The first redistribution layer 117 may comprise aluminum, but other materials, such as copper, may alternatively be used. The first redistribution layer 117 may be formed using a deposition process, such as sputtering, to form a layer of material (not separately shown in FIG. 1) and portions of the layer of material may then be removed through a suitable process (such as photolithographic masking and etching) to form the first redistribution layer 117. However, any other suitable process may be utilized to form the first redistribution layer 117. The first redistribution layer 117 may be formed to have a second thickness $T_2$ over the first passivation layer 113 of between about 10 KÅ and about 40 KÅ, such as about 28 KÅ.

The first redistribution layer 117 may also be formed with a first section, such as a landing pad section, that extends through the first opening 115 of the first passivation layer 113 to make electrical connection with the underlying top metal layer 109 to provide electrical connectivity to the top metal layer 109 as well as to provide a landing pad region for connection to overlying conductive structures. In an embodiment the first section may be formed with a second width $W_2$ of between about 30 μm and about 80 μm, such as about 60 μm.

Additionally, a second section of the first redistribution layer 117 may be formed over the first passivation layer 113. In an embodiment the second section of the first redistribution layer 117 may be used to provide routing and redistribution of the electrical signals, and may be formed to have a third width $W_3$ of between about 1 μm and about 20 μm, such as about 3 μm. However, any suitable dimensions may be used for the first section and the second section of the first redistribution layer 117.

FIG. 1 additionally illustrates a formation of a first polymer layer 121 (or protective layer) over and in direct physical contact with the first redistribution layer 117 and the first passivation layer 113. In an embodiment the first polymer layer 121 is formed of a polymer such as a polyimide, polybenzoxazole (PBO), benzocyclobutene (BCB), and the like, using a process such as spin coating, laminating, or the like. The first polymer layer 121 may be formed to a third thickness $T_3$ over the first passivation layer 113 of between about 1 μm and about 7 μm, such as about 4 μm.

In an embodiment the first polymer layer 121 may be formed in situ after the formation the first redistribution layer 117 and before the first redistribution layer 117 has been exposed to a reactive atmosphere such as an ambient atmosphere which comprises oxygen. By forming the first polymer layer 121 in situ and before exposure to a reactive atmosphere, the need for a separate passivation layer over the first redistribution layer 117 in order to protect the first redistribution layer 117 between processes may be removed. As such, the unnecessary passivation layer may be removed from the process, making the device thinner and smaller and the manufacturing process more efficient.

After the first polymer layer 121 has been formed, one or more second openings 123 may be made through the first polymer layer 121 by removing portions of the first polymer layer 121 to expose one or more portions of the first redistribution layer 117. The second openings 123 allows for contact between the first redistribution layer 117 and a first conductive element 301 (otherwise known as a via0, not illustrated in FIG. 1 but illustrated and described below with respect to FIG. 3). The second openings 123 may be formed using a suitable photolithographic mask and etching process, although any suitable process to expose portions of the first redistribution layer 117 may be used. Additionally, the second openings 123 may be formed to have a fourth width $W_4$ of between about 3 μm and about 20 μm.

In an embodiment the second openings 123 may be shaped so as to leave a support structure 125 of the material of the first polymer layer 121. The support structure 125 of the material of the first polymer layer 121 will provide additional structural support for an overlying first conductive element 301 (not illustrated in FIG. 1 but illustrated and discussed below with respect to FIG. 3). Such additional support allows for thinner first conductive element 301 to be formed without structural complications such as a concave surface that usually forms with thinner structures. In an embodiment the support structure 125 may be circular and has a fourth thickness $T_4$ that may be a difference between the third thickness $T_3$ (of the first polymer layer 121 over the first passivation layer 113) and the second thickness $T_2$ (of the first redistribution layer 117), such as by being between about 10 KÅ and about 40 KÅ, such as about 28 KÅ, although any suitable dimensions may be utilized. Additionally, the support structure 125 may be formed with a fifth width $W_5$ of between about 10 μm and about 60 μm, such as about 28 μm.

Figure 2:
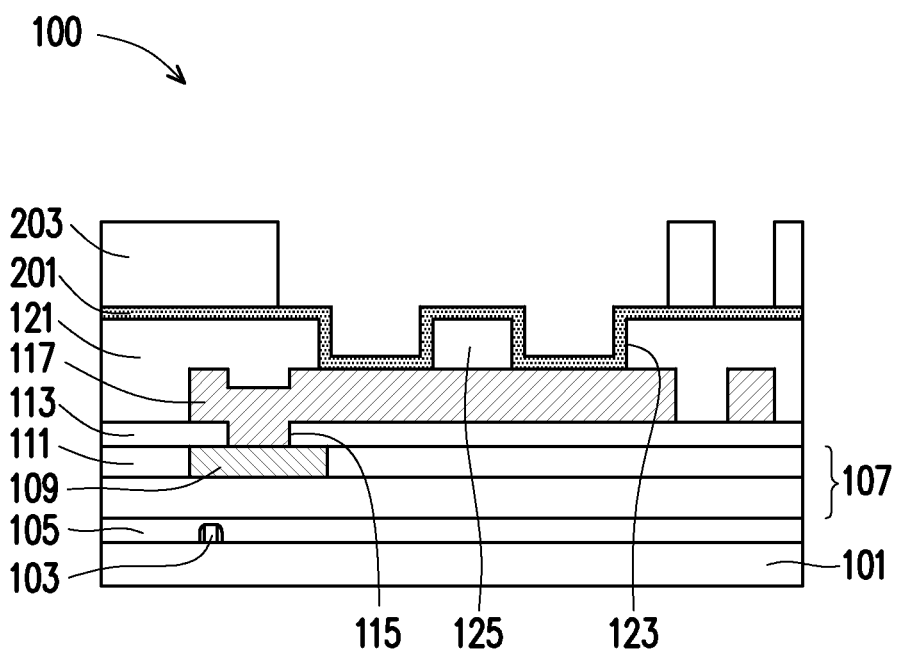
FIG. 2 illustrates a formation of a seed layer in accordance with some embodiments.

FIG. 2 illustrates a formation of a first seed layer 201 through the second opening 123 and in electrical connection with the first redistribution layer 117. In an embodiment, the first seed layer 201 is a thin layer of a conductive material that aids in the formation of a thicker layer during subsequent processing steps. The first seed layer 201 may comprise a layer of titanium about 500 Å thick followed by a layer of copper about 3,000 Å thick. The first seed layer 201 may be created using processes such as sputtering, evaporation, or PECVD processes, depending upon the desired materials. The first seed layer 201 may be formed to have a thickness of between about 0.1 μm and about 1 μm, such as about 0.3 μm.

Once the first seed layer 201 has been formed, a first photoresist 203 is placed on the first seed layer 201 and patterned to expose the first seed layer 201 where the first conductive element 301 is desired to be formed. In an embodiment the first photoresist 203 may be placed on the first seed layer 201 using, e.g., a spin coating technique to a height of between about 3 μm and about 35 μm, such as about 11 μm. Once in place, the first photoresist 203 may then be patterned by exposing the first photoresist 203 to a patterned energy source (e.g., a patterned light source) so as to induce a chemical reaction, thereby inducing a physical change in those portions of the first photoresist 203 exposed to the patterned light source. A developer is then applied to the exposed first photoresist 203 to take advantage of the physical changes and selectively remove either the exposed portion of the first photoresist 203 or the unexposed portion of the first photoresist 203, depending upon the desired pattern. In an embodiment the pattern formed into the first photoresist 203 is a pattern for a first conductive element 301.

Optionally, if desired, the first photoresist 203 may also be patterned in a pattern for a second redistribution layer 305 (not illustrated in FIG. 2 but illustrated and described below with respect to FIG. 3A). Such a pattern allows for the second redistribution layer 305 to be formed in the same layer as the first conductive element 301.

Figure 3A:
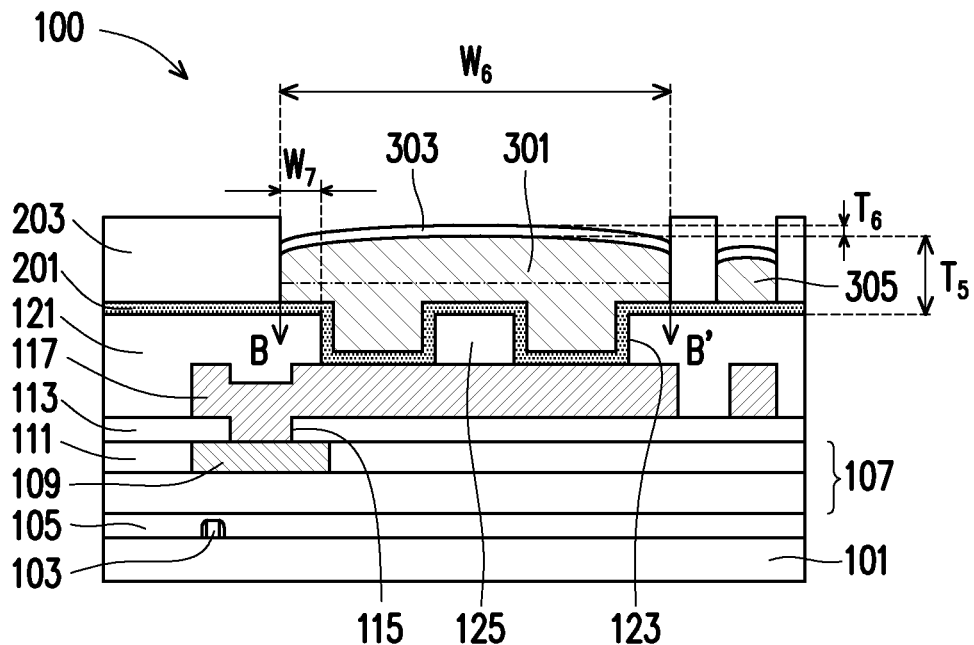
FIGS. 3A-3C illustrate a formation of a first conductive element in accordance with some embodiments.

FIG. 3A illustrates that, once patterned, an electroplating process is used to form the first conductive element 301 and, if desired, the second redistribution layer 305. In an embodiment the electroplating process may be used wherein the first seed layer 201 and the first photoresist 203 are submerged or immersed in an electroplating solution. The first seed layer 201 surface is electrically connected to the negative side of an external DC power supply such that the first seed layer 201 functions as the cathode in the electroplating process. A solid conductive anode, such as a copper anode, is also immersed in the solution and is attached to the positive side of the power supply. The atoms from the anode are dissolved into the solution, from which the cathode, e.g., the first seed layer 201, acquires the dissolved atoms, thereby plating the exposed conductive areas of the first seed layer 201 within the opening of the first photoresist 203.

In an embodiment the first conductive element 301 may be formed within the first photoresist 203 such that the combination of the first seed layer 201 and the first conductive element 301 has a fifth thickness $T_5$ over the first polymer layer 121 of between about 2 μm and about 10 μm, such as about 3 μm. Additionally, the first conductive element 301 may have a sixth width $W_6$ of between about 30 μm and about 70 μm, such as about 50 μm. This results in an overhanging portion of the first conductive element 301 to have a seventh width $W_7$ of between about 1 μm and about 15 μm, such as about 5 μm. However, any suitable dimensions may be utilized.

Figure 3B:
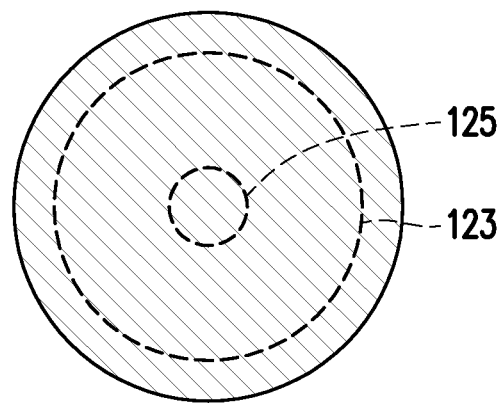

FIG. 3B illustrates a top-down view of the first conductive element 301 along line B-B' in FIG. 3A. In this view it can be seen that, in some embodiments, the support structure 125 may extend upwards from the first redistribution layer 117 and be located centrally to the first conductive element 301. As such, the second openings 123 in this top-down view will form a donut shaped opening around the support structure 125. In an embodiment in which the structural support 125 has the fifth width $W_5$ and the second opening 123 has the fourth width $W_4$, the second opening 123 will have an area (in the top-down view of FIG. 3B) of between about 942 μm² (when the fourth width $W_4$ is 10 μm and fifth width $W_5$ is 10 μm) and about 1177.5 μm² (when the fourth width $W_4$ is 15 μm and fifth width $W_5$ is 10 μm). As such, the use of the donut trench shape with the support structure 125 will actually have a larger area in contact with the underlying first redistribution layer 117.

By forming the support structure 125 in place to provide additional support for the first conductive element 301 as the first conductive element 301 is being formed, certain defects that would normally occur when the first conductive element 301 has a thinner structure may be avoided. For example, while other structures may need a thickness of 23 μm or greater to avoid a concave surface, the additional support from the support structure 125 may help reduce or eliminate the presence of a concave surface that may have deleterious effects at the desired thicknesses discussed above, and the plating process may form a convex surface. Such a thinning of the first conductive element 301 will help to prevent defects while at the same time reducing costs in the form of material.

Figure 3C:
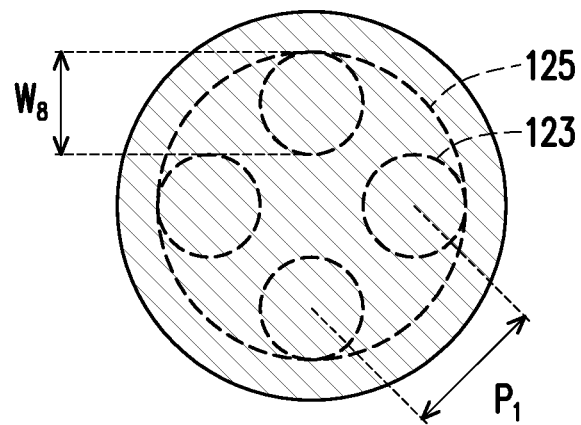

FIG. 3C illustrates a top-down view of the first conductive element 301 in another embodiment which utilizes multiple ones of the second openings 123 (which, once filled with conductive material, forms multiple vias) in order to provide the desired connectivity while the remainder of the structure provides the additional desired support. In an embodiment, while there are four second openings 123 illustrated, the number of second openings 123 may be two second openings 123 or greater, such as three second openings 123, four second openings 123 (as illustrated), five second openings 123, six second openings 123, or the like. Any suitable number of second openings 123 may be utilized to provide the desired electrical connectivity while still maintaining the desired structural support.

In this embodiment each of the second openings 123 may have an eighth width $W_8$ of between about 3 μm and about 20 μm, such as about 10 μm. Additionally, in an embodiment in which there are four second openings 123 (as illustrated in FIG. 3C), the area of the second openings 123 (and the conductive material within the second openings 123) is four times the area of each individual second opening 123, such as being between about 28.26 μm² and about 1256 μm², such as about 314 μm². In an embodiment the second openings 123 may be arranged in a circular fashion around a center of the first conductive element 301 and may be spaced apart from each other with a first pitch $P_1$ of between about 6 μm and about 40 μm, such as about 20 μm.

Additionally in this embodiment, the support structure 125 is that portion of the first polymer layer 121 that remains below a top surface of the first polymer layer 121 that is not removed by the formation of the second openings 123. As such, the support structure is located in a region between the second openings 123. However, any suitable arrangement between the second openings 123 and the support structure 125 may be utilized.

Returning now to FIG. 3A, once the first conductive element 301 has been formed, a cap layer 303 may be formed over the first conductive element 301 in order to provide some protection for the first conductive element 301 during subsequent processes such as testing. In an embodiment the cap layer 303 may be a solder cap formed using a process such as solder plating to a sixth thickness $T_6$ of between about 1 μm and about 5 μm, such as about 2 μm. However, any suitable thickness may be utilized.

Figure 4:
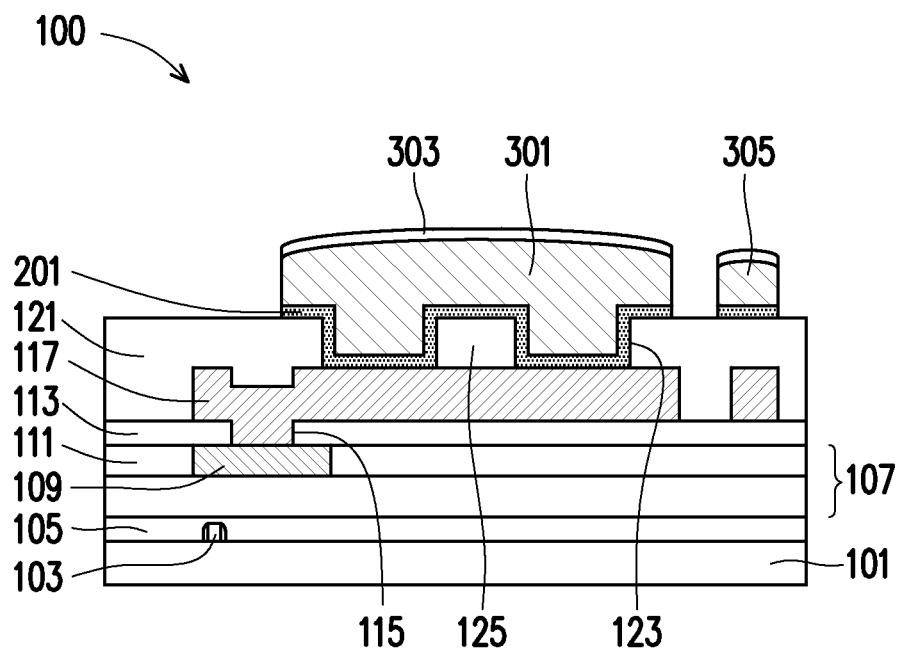
FIG. 4 illustrates a removal of a photoresist in accordance with some embodiments.

FIG. 4 illustrates a removal of the first photoresist 203. Once the first conductive element 301 has been formed using the first photoresist 203 and the first seed layer 201, the first photoresist 203 may be removed using a suitable removal process. In an embodiment, a plasma ashing process may be used to remove the first photoresist 203, whereby the temperature of the first photoresist 203 may be increased until the first photoresist 203 experiences a thermal decomposition and may be removed. However, any other suitable process, such as a wet strip, may alternatively be utilized. The removal of the first photoresist 203 may expose the underlying portions of the first seed layer 201.

After the removal of the first photoresist 203 exposes the underlying first seed layer 201, these portions are removed. In an embodiment the exposed portions of the first seed layer 201 (e.g., those portions that are not covered by the first conductive element 301) may be removed by, for example, a wet or dry etching process. For example, in a dry etching process reactants may be directed towards the first seed layer 201, using the first conductive element 301 as a mask. Alternatively, etchants may be sprayed or otherwise put into contact with the first seed layer 201 in order to remove the exposed portions of the first seed layer 201.

Figure 5:
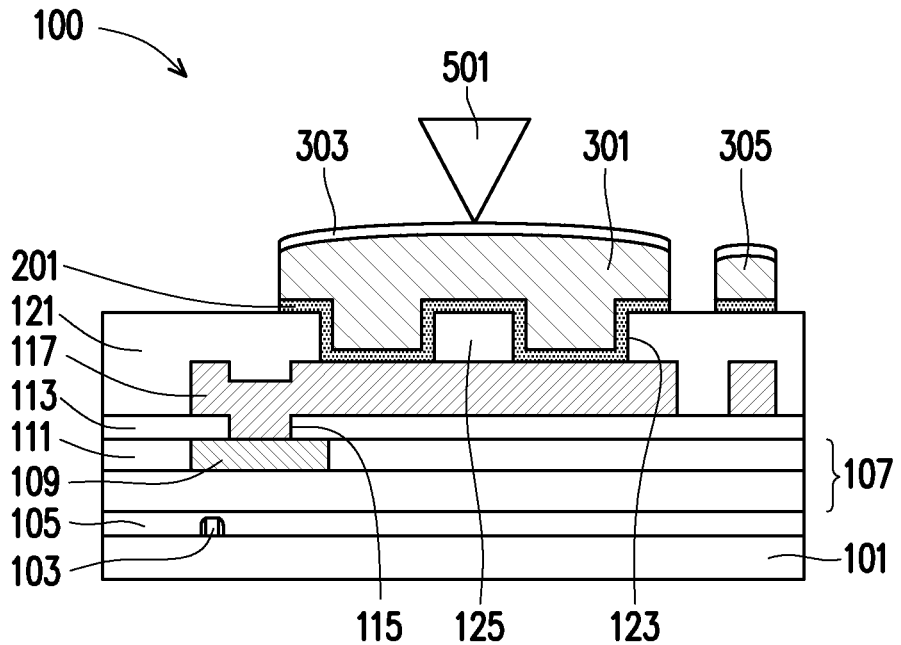
FIG. 5 illustrates a testing in accordance with some embodiments.

FIG. 5 illustrates a circuit probe (CP) test that may be performed at this stage in order to check for defective devices. In an embodiment of the circuit probe test one or more probes (represented in FIG. 5 by the triangle labeled 501) are electrically connected to the first conductive element 301 while the first conductive element 301 is protected by the cap layer 303 and signals are sent into the first conductive element 301. Without the presence of the concave surface (that would be present if the support structure 125 were present), there are no additional issues with the CP test that might register as defects. If there are no other significant defects, the probes will receive a predetermined output, and defective structures can be identified. Once identified, defective structures can be removed prior to further processing in order to make the overall process more efficient.

Figure 6:
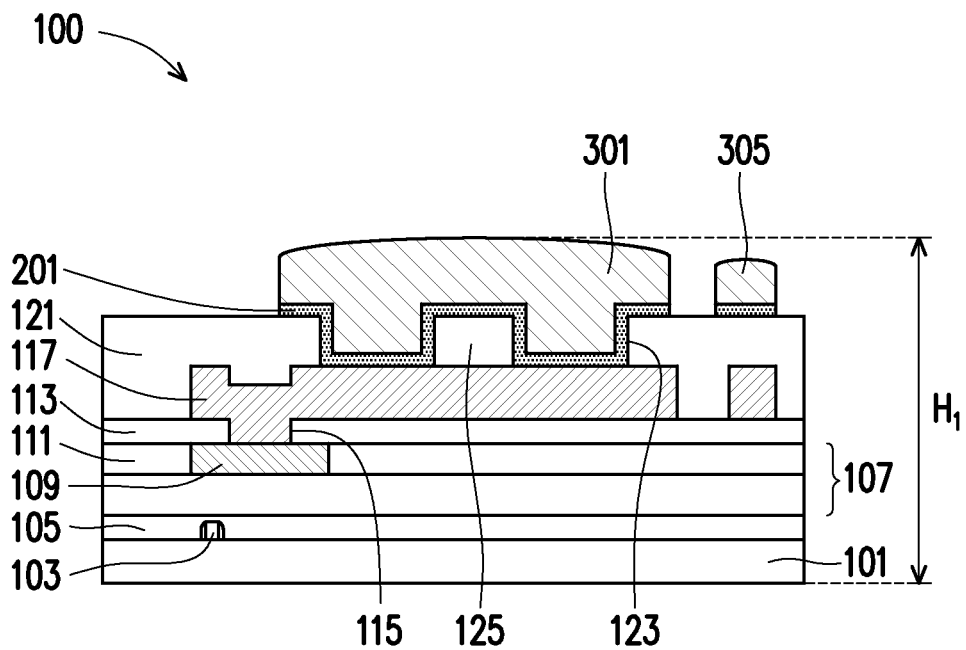
FIG. 6 illustrates a removal of a cap layer in accordance with some embodiments.

FIG. 6 illustrates a removal of the cap layer 303 after the circuit probe test. In an embodiment the cap layer 303 may be removed using one or more etching processes that will selectively remove the cap layer 303 while not removing or only slightly removing the first conductive element 301. For example, a wet etch or a dry etch may be utilized to selectively remove the cap layer 303 and expose the first conductive element 301. However, any suitable method of removing the cap layer 303 may be utilized.

Once the cap layer 303 has been removed, a singulation of the structure may be performed. In an embodiment the singulation may be performed by using a laser or a saw blade (not shown) to slice through structure surrounding the semiconductor device 100, thereby separating one section from another to form the semiconductor device 100. However, as one of ordinary skill in the art will recognize, utilizing a saw blade to singulate the semiconductor device 100 is merely one illustrative embodiment and is not intended to be limiting. Alternative methods for singulating the semiconductor device 100, such as utilizing one or more etches to separate the semiconductor device 100, may alternatively be utilized. These methods and any other suitable methods may alternatively be utilized to singulate the semiconductor device 100.

By making the first conductive element 301 thinner, the overall height of the semiconductor device 100 may be reduced. For example, in an embodiment in which the first conductive element 301 has the fifth thickness $T_5$ over the first polymer layer 121, the semiconductor device 100 may have a first height $H_1$ of between about 50 μm and about 300 μm, such as about 200 μm. However, any suitable height may be utilized.

Figure 7:
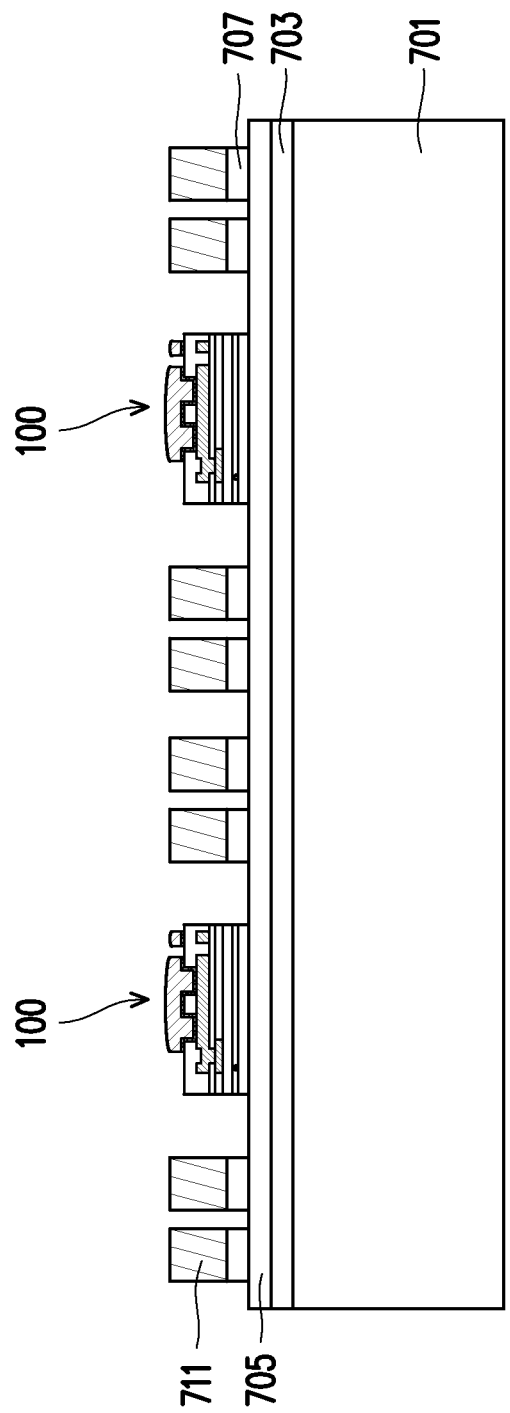
FIGS. 7-9 illustrate a formation of an integrated fan out structure in accordance with some embodiments.

FIG. 7 illustrates a beginning of an embodiment in which the semiconductor device 100 is utilized within an integrated fan out (InFO) package. In this embodiment, an adhesive layer 703, a polymer layer 705, and a second seed layer 707 are placed over a first carrier substrate 701. The first carrier substrate 701 comprises, for example, silicon based materials, such as glass or silicon oxide, or other materials, such as aluminum oxide, combinations of any of these materials, or the like. The first carrier substrate 701 is planar in order to accommodate an attachment of multiple ones of the semiconductor device 100.

The adhesive layer 703 is placed on the first carrier substrate 701 in order to assist in the adherence of overlying structures (e.g., the polymer layer 705). In an embodiment the adhesive layer 703 may comprise an ultra-violet glue, which loses its adhesive properties when exposed to ultra-violet light. However, other types of adhesives, such as pressure sensitive adhesives, radiation curable adhesives, epoxies, combinations of these, or the like, may also be used. The adhesive layer 703 may be placed onto the first carrier substrate 701 in a semi-liquid or gel form, which is readily deformable under pressure.

The polymer layer 705 is placed over the adhesive layer 703 and is utilized in order to provide protection to, e.g., the semiconductor devices 100 once the semiconductor devices 100 have been attached. In an embodiment the polymer layer 705 may be a positive tone material such as polybenzoxazole (PBO, such as the material HD8820), although any suitable material, such as polyimide or a polyimide derivative, may also be utilized. The polymer layer 705 may be placed using, e.g., a spin-coating process to a thickness of between about 0.5 μm and about 10 μm, such as about 5 μm, although any suitable method and thickness may be used.

The second seed layer 707 is formed over the polymer layer 705. In an embodiment the second seed layer 707 is a thin layer of a conductive material that aids in the formation of a thicker layer during subsequent processing steps. The second seed layer 707 may comprise a layer of titanium about 500 Å thick followed by a layer of copper about 3,000 Å thick. The second seed layer 707 may be created using processes such as sputtering, evaporation, or PECVD processes, depending upon the desired materials. The second seed layer 707 may be formed to have a thickness of between about 0.1 μm and about 1 μm, such as about 0.3 μm.

Once the second seed layer 707 has been formed, a second photoresist (not shown) may be placed and patterned over the second seed layer 707. In an embodiment the second photoresist may be placed on the second seed layer 707 using, e.g., a spin coating technique to a height of between about 80 μm and about 320 μm, such as about 240 μm. Once in place, the second photoresist may then be patterned by exposing the second photoresist to a patterned energy source (e.g., a patterned light source) so as to induce a chemical reaction, thereby inducing a physical change in those portions of the second photoresist exposed to the patterned light source. A developer is then applied to the exposed second photoresist to take advantage of the physical changes and selectively remove either the exposed portion of the second photoresist or the unexposed portion of the second photoresist, depending upon the desired pattern.

In an embodiment the pattern formed into the second photoresist is a pattern for vias 711. The vias 711 are formed in such a placement as to be located on different sides of subsequently attached devices such as the semiconductor devices 100. However, any suitable arrangement for the pattern of vias 711, such as by being located such that the semiconductor devices 100 are placed on opposing sides of the vias 711, may be utilized.

In an embodiment the vias 711 are formed within the second photoresist, wherein the vias 711 comprise one or more conductive materials, such as copper, solder, tungsten, other conductive metals, or the like, and may be formed, for example, by electroplating, electroless plating, or the like. In an embodiment, an electroplating process is used wherein the second seed layer 707 and the second photoresist are submerged or immersed in an electroplating solution. The second seed layer 707 surface is electrically connected to the negative side of an external DC power supply such that the second seed layer 707 functions as the cathode in the electroplating process. A solid conductive anode, such as a copper anode, is also immersed in the solution and is attached to the positive side of the power supply. The atoms from the anode are dissolved into the solution, from which the cathode, e.g., the second seed layer 707, acquires the dissolved atoms, thereby plating the exposed conductive areas of the second seed layer 707 within the opening of the second photoresist.

Once the vias 711 have been formed using the second photoresist and the second seed layer 707, the second photoresist may be removed using a suitable removal process. In an embodiment, a plasma ashing process may be used to remove the second photoresist, whereby the temperature of the second photoresist may be increased until the second photoresist experiences a thermal decomposition and may be removed. However, any other suitable process, such as a wet strip, may alternatively be utilized. The removal of the second photoresist may expose the underlying portions of the second seed layer 707.

Once exposed a removal of the exposed portions of the second seed layer 707 may be performed. In an embodiment the exposed portions of the second seed layer 707 (e.g., those portions that are not covered by the vias 711) may be removed by, for example, a wet or dry etching process. For example, in a dry etching process reactants may be directed towards the second seed layer 707 using the vias 711 as masks. In another embodiment, etchants may be sprayed or otherwise put into contact with the second seed layer 707 in order to remove the exposed portions of the second seed layer 707. After the exposed portion of the second seed layer 707 has been etched away, a portion of the polymer layer 705 is exposed between the vias 711.

FIG. 7 also illustrates a placement of the semiconductor devices 100 onto the polymer layer 705 between the vias 711. In an embodiment a die attach film (DAF) (not shown) may be placed on the semiconductor device 100 in order to assist in the attachment of the semiconductor devices 100 to the polymer layer 705. In an embodiment the die attach film is an epoxy resin, a phenol resin, acrylic rubber, silica filler, or a combination thereof, and is applied using a lamination technique. However, any other suitable alternative material and method of formation may alternatively be utilized. In an embodiment the semiconductor devices 100 may be placed onto the polymer layer 705 using, e.g., a pick and place process. However, any other method of placing the semiconductor devices 100 may also be utilized.

Figure 8:
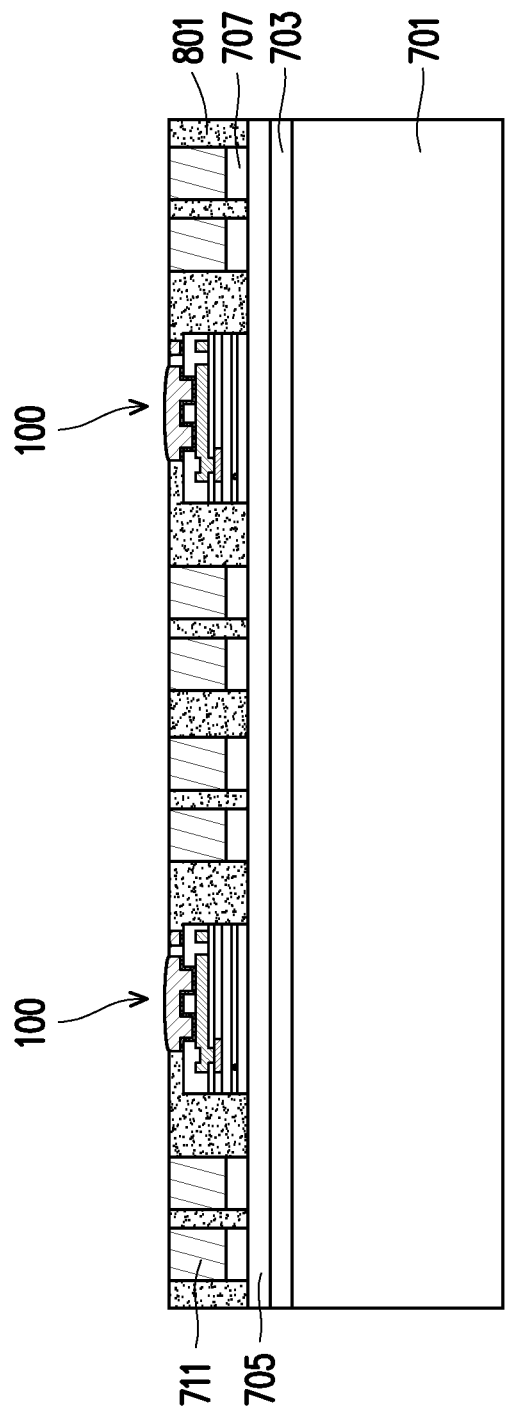

FIG. 8 illustrates an encapsulation of the vias 711 and the semiconductor devices 100. The encapsulation may be performed in a molding device (not illustrated in FIG. 8), which may comprise a top molding portion and a bottom molding portion separable from the top molding portion. When the top molding portion is lowered to be adjacent to the bottom molding portion, a molding cavity may be formed for the first carrier substrate 701, the vias 711, and the semiconductor devices 100.

During the encapsulation process the top molding portion may be placed adjacent to the bottom molding portion, thereby enclosing the first carrier substrate 701, the vias 711, and the semiconductor devices 100 within the molding cavity. Once enclosed, the top molding portion and the bottom molding portion may form an airtight seal in order to control the influx and outflux of gasses from the molding cavity. Once sealed, an encapsulant 801 may be placed within the molding cavity. The encapsulant 801 may be a molding compound resin such as polyimide, PPS, PEEK, PES, a heat resistant crystal resin, combinations of these, or the like. The encapsulant 801 may be placed within the molding cavity prior to the alignment of the top molding portion and the bottom molding portion, or else may be injected into the molding cavity through an injection port.

Once the encapsulant 801 has been placed into the molding cavity such that the encapsulant 801 encapsulates the first carrier substrate 701, the vias 711, and the semiconductor devices 100, the encapsulant 801 may be cured in order to harden the encapsulant 801 for optimum protection. While the exact curing process is dependent at least in part on the particular material chosen for the encapsulant 801, in an embodiment in which molding compound is chosen as the encapsulant 801, the curing could occur through a process such as heating the encapsulant 801 to between about 100° C. and about 130° C., such as about 125° C. for about 60 sec to about 3000 sec, such as about 600 sec. Additionally, initiators and/or catalysts may be included within the encapsulant 801 to better control the curing process.

However, as one having ordinary skill in the art will recognize, the curing process described above is merely an exemplary process and is not meant to limit the current embodiments. Other curing processes, such as irradiation or even allowing the encapsulant 801 to harden at ambient temperature, may alternatively be used. Any suitable curing process may be used, and all such processes are fully intended to be included within the scope of the embodiments discussed herein.

FIG. 8 also illustrates a thinning of the encapsulant 801 in order to expose the vias 711 and the semiconductor devices 100 for further processing. The thinning may be performed, e.g., using a mechanical grinding or chemical mechanical polishing (CMP) process whereby chemical etchants and abrasives are utilized to react and grind away the encapsulant 801 until the vias 711 and the first conductive element 301 (on the semiconductor devices 100) have been exposed. As such, the semiconductor devices 100 and the vias 711 may have a planar surface that is also planar with the encapsulant 801.

However, while the CMP process described above is presented as one illustrative embodiment, it is not intended to be limiting to the embodiments. Any other suitable removal process may alternatively be used to thin the encapsulant 801 and the semiconductor devices 100 and expose the vias 711. For example, a series of chemical etches may be utilized. This process and any other suitable process may alternatively be utilized to thin the encapsulant 801, and all such processes are fully intended to be included within the scope of the embodiments.

Figure 9:
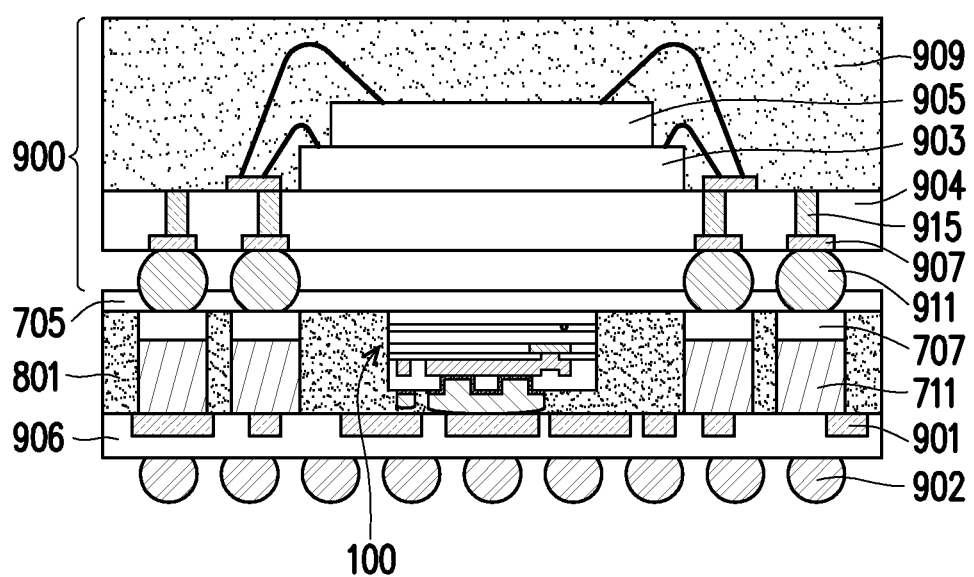

FIG. 9 illustrates a formation of a third redistribution layer 901 in order to interconnect the semiconductor devices 100, the vias 711 and first external connections 902. In an embodiment the third redistribution layer 901 may be formed by initially forming a seed layer (not shown) of a titanium copper alloy through a suitable formation process such as CVD or sputtering. A photoresist (also not shown) may then be formed to cover the seed layer, and the photoresist may then be patterned to expose those portions of the seed layer that are located where the third redistribution layer 901 is desired to be located.

Once the photoresist has been formed and patterned, a conductive material, such as copper, may be formed on the seed layer through a deposition process such as plating. The conductive material may be formed to have a thickness of between about 1 µm and about 10 µm, such as about 5 µm. However, while the material and methods discussed are suitable to form the conductive material, these materials are merely exemplary. Any other suitable materials, such as AlCu or Au, and any other suitable processes of formation, such as CVD or PVD, may alternatively be used to form the third redistribution layer 901.

Once the conductive material has been formed, the photoresist may be removed through a suitable removal process such as ashing. Additionally, after the removal of the photoresist, those portions of the seed layer that were covered by the photoresist may be removed through, for example, a suitable etch process using the conductive material as a mask.

FIG. 9 also illustrates a formation of a second passivation layer 906 over the third redistribution layer 901 in order to provide protection and isolation for the third redistribution layer 901 and the other underlying structures. In an embodiment the second passivation layer 906 may be polybenzoxazole (PBO), although any suitable material, such as polyimide or a polyimide derivative, may alternatively be utilized. The second passivation layer 906 may be placed using, e.g., a spin-coating process to a thickness of between about 1 µm and about 25 µm, such as about 7 µm, although any suitable method and thickness may alternatively be used.

Additionally, while FIG. 9 only illustrates a single third redistribution layer 901 and a single second passivation layer 906, this is done for clarity and is not intended to limit the embodiments. Rather, the above processes to form the single third redistribution layer 901 and the single second passivation layer 906 may be repeated one or more times to form a plurality of third redistribution layers 901 and second passivation layers 906 as desired. Any suitable number of third redistribution layers 901 may be utilized.

FIG. 9 additionally illustrates a formation of first external connections 902 and underbump metallizations (not separately illustrated) to make electrical contact with the third redistribution layer 901. In an embodiment the underbump metallizations may each comprise three layers of conductive materials, such as a layer of titanium, a layer of copper, and a layer of nickel. However, one of ordinary skill in the art will recognize that there are many suitable arrangements of materials and layers, such as an arrangement of chrome/chrome-copper alloy/copper/gold, an arrangement of titanium/titanium tungsten/copper, or an arrangement of copper/nickel/gold, that are suitable for the formation of the underbump metallizations. Any suitable materials or layers of material that may be used for the underbump metallizations are fully intended to be included within the scope of the embodiments.

In an embodiment the underbump metallizations are created by forming each layer over and in electrical connection with the third redistribution layer 901. The forming of each layer may be performed using a plating process, such as electrochemical plating, although other processes of formation, such as sputtering, evaporation, or PECVD process, may be used depending upon the desired materials. The underbump metallizations may be formed to have a thickness of between about 0.7 µm and about 10 µm, such as about 7 µm.

In an embodiment the first external connections 902 may be placed on the underbump metallizations and may be a ball grid array (BGA) which comprises a eutectic material such as solder, although any suitable materials may alternatively be used. In an embodiment in which the first external connections 902 are solder balls, the first external connections 902 may be formed using a ball drop method, such as a direct ball drop process. Alternatively, the solder balls may be formed by initially forming a layer of tin through any suitable method such as evaporation, electroplating, printing, solder transfer, and then performing a reflow in order to shape the material into the desired bump shape. Once the first external connections 902 have been formed, a test may be performed to ensure that the structure is suitable for further processing.

FIG. 9 also illustrates a debonding of the first carrier substrate 701 from the semiconductor devices 100. In an embodiment the first external connections 902 and, hence, the structure including the semiconductor devices 100, may be attached to a ring structure (not separately illustrated in FIG. 9). The ring structure may be a metal ring intended to provide support and stability for the structure during and after the debonding process. In an embodiment the first external connections 902 and the semiconductor devices 100 are attached to the ring structure using, e.g., an ultraviolet tape (also not illustrated in FIG. 9), although any other suitable adhesive or attachment may alternatively be used.

Once the first external connections 902 and, hence, the structure including the semiconductor devices 100 are attached to the ring structure, the first carrier substrate 701 may be debonded from the structure including the semiconductor devices 100 using, e.g., a thermal process to alter the adhesive properties of the adhesive layer 703. In a particular embodiment an energy source such as an ultraviolet (UV) laser, a carbon dioxide ($CO_2$) laser, or an infrared (IR) laser, is utilized to irradiate and heat the adhesive layer 703 until the adhesive layer 703 loses at least some of its adhesive properties. Once performed, the first carrier substrate 701 and the adhesive layer 703 may be physically separated and removed from the structure comprising the first external connections 902, and the semiconductor devices 100.

However, while a ring structure may be used to support the first external connections 902, such as description is merely one method that may be used and is not intended to be limiting upon the embodiments. In another embodiment the first external connections 902 may be attached to a second carrier substrate using, e.g., a first glue. In an embodiment the second carrier substrate is similar to the first carrier substrate 701, although it may also be different. Once attached, the adhesive layer 703 may be irradiated and the adhesive layer 703 and the first carrier substrate 701 may be physically removed.

FIG. 9 also illustrates a patterning of the polymer layer 705 in order to expose the vias 711 (along with the associated second seed layer 707). In an embodiment the polymer layer 705 may be patterned using, e.g., a laser drilling method. In such a method a protective layer, such as a light-to-heat conversion (LTHC) layer or a hogomax layer (not separately illustrated in FIG. 9) is first deposited over the polymer layer 705. Once protected, a laser is directed towards those portions of the polymer layer 705 which are desired to be removed in order to expose the underlying vias

711. During the laser drilling process the drill energy may be in a range from 0.1 mJ to about 30 mJ, and a drill angle of about 0 degree (perpendicular to the polymer layer 705) to about 85 degrees to normal of the polymer layer 705. In an embodiment the patterning may be formed to form openings over the vias 711 to have a width of between about 100 μm and about 300 μm, such as about 200 μm.

In another embodiment, the polymer layer 705 may be patterned by initially applying a photoresist (not individually illustrated in FIG. 9) to the polymer layer 705 and then exposing the photoresist to a patterned energy source (e.g., a patterned light source) so as to induce a chemical reaction, thereby inducing a physical change in those portions of the photoresist exposed to the patterned light source. A developer is then applied to the exposed photoresist to take advantage of the physical changes and selectively remove either the exposed portion of the photoresist or the unexposed portion of the photoresist, depending upon the desired pattern, and the underlying exposed portion of the polymer layer 705 are removed with, e.g., a dry etch process. However, any other suitable method for patterning the polymer layer 705 may be utilized.

FIG. 9 additionally illustrates a bonding of a first package 900. In an embodiment the first package 900 may comprise a package substrate 904, a second semiconductor device 903, a third semiconductor device 905 (bonded to the second semiconductor device 903), contact pads 907, a second encapsulant 909, and second external connections 911. In an embodiment the package substrate 904 may be, e.g., a packaging substrate comprising internal interconnects (e.g., through substrate vias 915) to connect the second semiconductor device 903 and the third semiconductor device 905 to the vias 711.

Alternatively, the package substrate 904 may be an interposer used as an intermediate substrate to connect the second semiconductor device 903 and the third semiconductor device 905 to the vias 711. In this embodiment the package substrate 904 may be, e.g., a silicon substrate, doped or undoped, or an active layer of a silicon-on-insulator (SOI) substrate. However, the package substrate 904 may also be a glass substrate, a ceramic substrate, a polymer substrate, or any other substrate that may provide a suitable protection and/or interconnection functionality. These and any other suitable materials may be used for the package substrate 904.

The second semiconductor device 903 may be a semiconductor device designed for an intended purpose such as being a logic die, a central processing unit (CPU) die, a memory die (e.g., a DRAM die), combinations of these, or the like. In an embodiment the second semiconductor device 903 comprises integrated circuit devices, such as transistors, capacitors, inductors, resistors, first metallization layers (not shown), and the like, therein, as desired for a particular functionality. In an embodiment the second semiconductor device 903 is designed and manufactured to work in conjunction with or concurrently with the semiconductor device 100.

The third semiconductor device 905 may be similar to the second semiconductor device 903. For example, the third semiconductor device 905 may be a semiconductor device designed for an intended purpose (e.g., a DRAM die) and comprising integrated circuit devices for a desired functionality. In an embodiment the third semiconductor device 905 is designed to work in conjunction with or concurrently with the semiconductor device 100 and/or the second semiconductor device 903.

The third semiconductor device 905 may be bonded to the second semiconductor device 903. In an embodiment the third semiconductor device 905 is only physically bonded with the second semiconductor device 903, such as by using an adhesive. In this embodiment the third semiconductor device 905 and the second semiconductor device 903 may be electrically connected to the package substrate 904 using, e.g., wire bonds, although any suitable electrical bonding may be alternatively be utilized.

Alternatively, the third semiconductor device 905 may be bonded to the second semiconductor device 903 both physically and electrically. In this embodiment the third semiconductor device 905 may comprise third external connections (not separately illustrated in FIG. 9) that connect with fourth external connection (also not separately illustrated in FIG. 9) on the second semiconductor device 903 in order to interconnect the third semiconductor device 905 with the second semiconductor device 903.

The contact pads 907 may be formed on the package substrate 904 to form electrical connections between the second semiconductor device 903 and, e.g., the second external connections 911. In an embodiment the contact pads 907 may be formed over and in electrical contact with electrical routing (such as through substrate vias 915) within the package substrate 904. The contact pads 907 may comprise aluminum, but other materials, such as copper, may alternatively be used. The contact pads 907 may be formed using a deposition process, such as sputtering, to form a layer of material (not shown) and portions of the layer of material may then be removed through a suitable process (such as photolithographic masking and etching) to form the contact pads 907. However, any other suitable process may be utilized to form the contact pads 907. The contact pads 907 may be formed to have a thickness of between about 0.5 μm and about 4 μm, such as about 1.45 μm.

The second encapsulant 909 may be used to encapsulate and protect the second semiconductor device 903, the third semiconductor device 905, and the package substrate 904. In an embodiment the second encapsulant 909 may be a molding compound and may be placed using a molding device (not illustrated in FIG. 9). For example, the package substrate 904, the second semiconductor device 903, and the third semiconductor device 905 may be placed within a cavity of the molding device, and the cavity may be hermetically sealed. The second encapsulant 909 may be placed within the cavity either before the cavity is hermetically sealed or else may be injected into the cavity through an injection port. In an embodiment the second encapsulant 909 may be a molding compound resin such as polyimide, PPS, PEEK, PES, a heat resistant crystal resin, combinations of these, or the like.

Once the second encapsulant 909 has been placed into the cavity such that the second encapsulant 909 encapsulates the region around the package substrate 904, the second semiconductor device 903, and the third semiconductor device 905, the second encapsulant 909 may be cured in order to harden the second encapsulant 909 for optimum protection. While the exact curing process is dependent at least in part on the particular material chosen for the second encapsulant 909, in an embodiment in which molding compound is chosen as the second encapsulant 909, the curing could occur through a process such as heating the second encapsulant 909 to between about 100° C. and about 130° C., such as about 125° C. for about 60 sec to about 3000 sec, such as about 600 sec. Additionally, initiators and/or catalysts may be included within the second encapsulant 909 to better control the curing process.

However, as one having ordinary skill in the art will recognize, the curing process described above is merely an exemplary process and is not meant to limit the current embodiments. Other curing processes, such as irradiation or even allowing the second encapsulant 909 to harden at ambient temperature, may alternatively be used. Any suitable curing process may be used, and all such processes are fully intended to be included within the scope of the embodiments discussed herein.

In an embodiment the second external connections 911 may be formed to provide an external connection between the package substrate 904 and, e.g., the vias 711. The second external connections 911 may be contact bumps such as microbumps or controlled collapse chip connection (C4) bumps and may comprise a material such as tin, or other suitable materials, such as silver or copper. In an embodiment in which the second external connections 911 are tin solder bumps, the second external connections 911 may be formed by initially forming a layer of tin through any suitable method such as evaporation, electroplating, printing, solder transfer, ball placement, etc, to a thickness of, e.g., about 100 µm. Once a layer of tin has been formed on the structure, a reflow is performed in order to shape the material into the desired bump shape.

Once the second external connections 911 have been formed, the second external connections 911 are aligned with and placed over the vias 711, and a bonding is performed. For example, in an embodiment in which the second external connections 911 are solder bumps, the bonding process may comprise a reflow process whereby the temperature of the second external connections 911 is raised to a point where the second external connections 911 will liquefy and flow, thereby bonding the first package 900 to the vias 711 once the second external connections 911 resolidifies.

Once the first package 900 is bonded, the first external connections 902 may be debonded from the ring structure and a singulation of the structure may be performed in order to form a first integrated fan out package-on-package (InFO-POP) structure. In an embodiment the first external connections 902 may be debonded from the ring structure by initially bonding the first package 900 to a second ring structure using, e.g., a second ultraviolet tape. Once bonded, the ultraviolet tape may be irradiated with ultraviolet radiation and, once the ultraviolet tape has lost its adhesiveness, the first external connections 902 may be physically separated from the ring structure.

Once debonded, a singulation of the structure to form the first InFO-POP structure is performed. In an embodiment the singulation may be performed by using a laser or a saw blade (not shown) to slice through the encapsulant 801 and the polymer layer 705 between the vias 711, thereby separating one section from another to form the first InFO-POP structure with the semiconductor device 100. However, as one of ordinary skill in the art will recognize, utilizing a saw blade to singulate the first InFO-POP structure is merely one illustrative embodiment and is not intended to be limiting. Alternative methods for singulating the first InFO-POP structure, such as utilizing one or more etches to separate the first InFO-POP structure, may alternatively be utilized. These methods and any other suitable methods may alternatively be utilized to singulate the first InFO-POP structure.

By forming the first conductive element 301 to be no greater than the fifth thickness $T_5$ and also by the support structure 125 to prevent the formation of a concave surface, the overall height of the manufactured structure may be reduced. By reducing the overall height, a smaller device may be formed, and fewer defects may occur during the manufacturing process.

In accordance with an embodiment, a semiconductor device comprising a first redistribution layer over a substrate is provided. A protective layer is over the first redistribution layer, the protective layer comprising a first material, and a first conductive material extends through a first opening in the protective layer to make electrical connection with the first redistribution layer, the first conductive material having a first thickness over the protective layer of less than about 3 µm. A support structure is located between the first conductive material and the first redistribution layer, wherein the support structure comprises the first material and is centered to the first conductive material is a top down view.

In accordance with another embodiment, a method of manufacturing a semiconductor device comprising depositing a dielectric layer over a redistribution layer, the dielectric layer comprising a first dielectric material is provided. At least one opening is formed through the dielectric layer, wherein the forming the at least one opening leaves a support structure of the first dielectric material between separate portions of the at least one opening. A conductive material is deposited into the at least one opening and also at least partially over the dielectric layer, wherein the depositing the conductive material deposits the conductive material over the dielectric layer to a thickness of no greater than about 3 µm.

In accordance with yet another embodiment, a method of manufacturing a semiconductor device comprising depositing a seed layer over a dielectric layer, wherein a first portion of the seed layer is in physical contact with a redistribution layer at a first point, a second portion of the seed layer is in physical contact with the redistribution layer at a second point electrically connected with the first point, and a third portion of the dielectric layer is located between the first point and the second point, is provided. A photoresist is applied and patterned over the seed layer, and a conductive material is plated onto the seed layer within the photoresist, wherein at an end of the plating the conductive material the conductive material and the seed layer have a combined thickness over the dielectric layer of less than about 3 µm.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
   depositing a dielectric layer over a redistribution layer, the dielectric layer comprising a first dielectric material;
   forming at least one opening through the dielectric layer, wherein the forming the at least one opening leaves a support structure of the first dielectric material between separate portions of the at least one opening; and depositing a conductive material into the at least one opening and also at least partially over the dielectric layer, wherein the depositing the conductive material deposits the conductive material over the dielectric layer to a thickness of no greater than about 3 µm.

2. The method of claim 1, further comprising forming a cap layer over the conductive material.

3. The method of claim 2, wherein the cap layer comprises solder and has a thickness of less than about 2 µm.

4. The method of claim 2, further comprising:
connecting the cap layer to a test probe; and
removing the cap layer.

5. The method of claim 1, wherein the forming the at least one opening comprises forming a circular opening that surrounds the support structure.

6. The method of claim 1, wherein the forming the at least one opening comprises forming two or more separate openings.

7. The method of claim 6, wherein the forming the at least one opening comprises forming four separate openings.

8. The method of claim 7, wherein each of the four separate openings has a diameter of about 10 µm.

9. A method of manufacturing a semiconductor device, the method comprising:
depositing a seed layer over a dielectric layer, wherein a first portion of the seed layer is in physical contact with a redistribution layer at a first point, a second portion of the seed layer is in physical contact with the redistribution layer at a second point electrically connected with the first point, and a third portion of the dielectric layer is located between the first point and the second point;
applying and patterning a photoresist over the seed layer; and
plating a conductive material onto the seed layer within the photoresist, wherein at an end of the plating the conductive material the conductive material and the seed layer have a combined thickness over the dielectric layer of less than about 3 µm.

10. The method of claim 9, further comprising plating a solder cap layer within the photoresist and onto the conductive material.

11. The method of claim 10, further comprising:
testing the semiconductor device after the plating the solder cap layer; and
removing the solder cap layer after the testing the semiconductor device.

12. The method of claim 9, wherein the first point and the second point are points located within a donut shaped trench.

13. The method of claim 9, wherein the first point is located in a first opening and the second point is located in a second opening different from the first opening.

14. The method of claim 9, wherein the plating the conductive material forms both an external connection and a redistribution layer, wherein the redistribution layer extends above the dielectric layer a same distance as the external connection.

15. A method of manufacturing a semiconductor device, the method comprising:
forming a first redistribution layer over a substrate;
forming a protective layer over the first redistribution layer, the protective layer comprising a first material;
forming a first conductive material extending through a first opening in the protective layer to make electrical connection with the first redistribution layer, the first conductive material having a first thickness over the protective layer of less than about 3 µm; and
forming a support structure located between the first conductive material and the first redistribution layer, wherein the support structure comprises the first material and is centered to the first conductive material is a top down view.

16. The method of claim 15, wherein the first opening surrounds the support structure in the top down view.

17. The method of claim 15, wherein the forming the first conductive material also forms the first conductive material extending through a second opening in the protective layer different from the first opening to make electrical connection with the first redistribution layer.

18. The method of claim 17, wherein the forming the first conductive material also forms the first conductive material extending through a third opening in the protective layer different from the first opening and the second opening and wherein the forming the first conductive material also forms the first conductive material extending through a fourth opening in the protective layer different from the first opening, the second opening, and the third opening.

19. The method of claim 15, further comprising forming a second redistribution layer over the protective layer, wherein the second redistribution layer has the first thickness.

20. The method of claim 15, wherein the first conductive material connects the first redistribution layer to an integrated fan out structure.

* * * * *